(12) United States Patent
Chen et al.

(10) Patent No.: US 6,995,050 B2
(45) Date of Patent: Feb. 7, 2006

(54) THIN FILM TRANSISTOR AND FABRICATION METHOD FOR SAME

(75) Inventors: Chen-Ming Chen, Taichung (TW); Yung-Fu Wu, Taipei (TW)

(73) Assignee: Industrial Technology Research Institute, Hsinchu (TW)

(*) Notice: Subject to any disclaimer, the term of this patent is extended or adjusted under 35 U.S.C. 154(b) by 0 days.

(21) Appl. No.: 10/975,470

(22) Filed: Oct. 29, 2004

(65) Prior Publication Data

US 2005/0059227 A1    Mar. 17, 2005

Related U.S. Application Data

(62) Division of application No. 10/651,009, filed on Aug. 29, 2003.

(30) Foreign Application Priority Data

May 30, 2003 (TW) .............................. 92114697 A

(51) Int. Cl.
*H01L 21/00* (2006.01)
(52) U.S. Cl. ........................................ 438/154; 257/72
(58) Field of Classification Search ............... 438/30, 438/149, 151–155, 164, 166; 257/72, 359
See application file for complete search history.

(56) References Cited

U.S. PATENT DOCUMENTS

| 5,612,234 A | 3/1997 | Ha |
| 5,913,113 A | 6/1999 | Seo |
| 5,953,598 A | 9/1999 | Hata et al. |
| 6,037,195 A | 3/2000 | Toriyama et al. |
| 6,759,350 B2 * | 7/2004 | Tsai ............................ 438/787 |

* cited by examiner

*Primary Examiner*—David Vu
(74) *Attorney, Agent, or Firm*—Birch, Stewart, Kolasch & Birch, LLP

(57) ABSTRACT

A thin film transistor and a method for fabricating the same. The thin film transistor comprises a substrate and a patterned semiconductive layer formed on the substrate, wherein the semiconductive layer comprises a channel region and doped regions adjacent to the channel region. A gate insulating layer is formed on the above structure. A gate electrode is located on the gate insulating layer above the channel region. Source and drain electrodes are located on the gate insulating layer adjacent to the semiconductive layer. A dielectric layer having contact holes is formed on the above structure and a patterned conductive layer is formed on predetermined parts of the dielectric layer electrically connecting the doped regions to the source and drain electrode through the contact holes.

21 Claims, 19 Drawing Sheets

THIN FILM TRANSISTOR AND FABRICATION METHOD FOR SAME

This application is a Divisional of co-pending application Ser. No. 10/651,009, filed on Aug. 29, 2003, and for which priority is claimed under 35 U.S.C. § 120; and this application claims priority of Application No. 092114697 filed in Taiwan, R.O.C. on May 30, 2003 under 35 U.S.C. § 119; the entire contents of all are hereby incorporated by reference.

BACKGROUND OF THE INVENTION

1. Field of the Invention

The present invention relates to a thin film transistor and fabricating method thereof. More particularly, the present invention relates to a thin film transistor and fabricating method thereof with fewer photolithography steps.

2. Description of the Related Art

Thin film transistors (TFTs) drive pixels in active matrix type liquid crystal display devices, active matrix type organic light-emitting display devices, image sensors and the like. Generally, TFTs used in these apparatuses are formed from silicon semiconductor thin film. Such silicon semiconductor thin films are roughly classified into two types: amorphous silicon (a-Si) semiconductor and crystalline silicon semiconductor films.

The crystalline silicon TFT is advantageous in that the surface of a crystalline silicon layer has a fewer defects than that of the amorphous silicon, thus the crystalline silicon TFT has a higher mobility. Currently crystalline silicon TFT is being substituted for amorphous silicon TFT in the fabrication of precise elements and pixel arrays. Compared to the number of process steps required to form an amorphous silicon TFT, however, more process steps are required to form crystalline silicon TFT hence, the process is more complicated and time-consuming.

FIGS. 1a to 1h are cross sections of the manufacturing process of a conventional complementary metal-oxide semiconductor. First, referring to FIG. 1a, a substrate 10 with a buffer layer 11 and an amorphous silicon layer 12 thereon is provided. Then the amorphous silicon layer 12 is crystallized to form a crystalline silicon layer 13, and the crystalline silicon layer 13 is patterned by photolithography to form silicon islands 13n and 13p, as shown in FIG. 1b.

Referring to FIG. 1c, an insulating film 15 and a conductive layer 16 are formed on the buffer layer 11 and silicon islands 13n and 13p, and the conductive layer 16 formed on the silicon island 13p of a p-type transistor is patterned by photolithography to serve as a gate electrode 16p. Furthermore, a mask layer 20 and the gate electrode 16p are used as masks to form a $p^+$ poly-silicon region 18p by p-type ion implantation of the silicon island 13p.

FIG. 1d shows the formation of a patterned resist layer 22 on the p-type transistor and prescribed parts of the conductive layer 16 located on the silicon island 13n for an n-type transistor. Next, the exposed conductive layer 16 is etched to form a gate electrode 16n of the n-type transistor. Then, the silicon island 13n is implanted with n-type ion to form an n+ poly-silicon region 18n, with the gate electrode 16n and the resist layer 22 acting as masks.

FIG. 1e shows the removal of part of the resist layer 22 located on the gate electrode 16n to form a resist layer 22a by isotropic etching. The gate electrode 16n is then etched to form a gate electrode 16n', with the resist layer 22a acting as a mask. The gate electrode 16n' and the resist layer 22a are then used as masks to form an $n^-$ poly-silicon region 28 by n-type ion implantation.

Referring next to FIG. 1f, the resist layer 22a is removed. A first silicon oxide layer 30 is then formed on the above structure and etched to form contact holes 30a by photolithography. Then, referring to FIG. 1g, signal lines 35 is formed into the contact holes, wherein the single line 35 is constructed of a first metal layer 31 and a second metal layer 32 patterned in a prescribed shape by photolithography.

Subsequently, referring to FIG. 1h, a second silicon oxide layer 40 is formed to act as a protective film. The second silicon oxide layer 40a is then etched to form a contact hole 40a in a region located over the signal line of the N-type thin film transistor by photolithography. Finally, a transparent conductive film constituting the contact hole 40a and a pixel electrode 50 is formed and patterned to provide a crystalline silicon TFT.

The conventional fabrication method described above requires nine photolithography steps, which increases costs and lowers throughput and yield.

Seeking to solve the previously described problem, a crystalline silicon TFT manufacturing process requiring fewer photolithography steps is disclosed. FIGS. 2a to 2e are schematic views showing the crystalline silicon TFT manufacturing process with fewer photolithography steps. First, referring to FIG. 2a, a substrate 100 with a first conductive layer thereon is provided. Next, the first conductive layer is etched to form a source electrode 101 and a drain electrode 103. A first insulating layer 102, an amorphous silicon layer 104, and a gate oxide layer 106 are then formed sequentially on the conductive layer.

FIG. 2b shows the conversion of the amorphous silicon layer 104 into a crystalline silicon layer 108 by crystallization. Next, using a photolithography and etching technique, the crystalline silicon layer 108 and the gate oxide layer 106 are patterned to prescribed forms.

Then, a second conductive layer is deposited on the gate oxide layer 106. Next, the second conductive layer and the gate oxide layer 106 are simultaneously etched to respectively form a gate electrode 120 and a gate oxide layer 106' by photolithography. Next, the crystalline silicon layer 108 is doped with impurity ions using the gate electrode 120 as a mask to define a drain region 123 and a source region 121, as shown in FIG. 2c.

A second insulating layer 112 comprising $SiO_2$ is then formed to cover the above. Next, the second insulating layer 112 is patterned to form a source region contact hole 131, a drain region contact hole 133, a source electrode contact hole 141, and a drain electrode contact hole 143 by photolithography, as shown in FIG. 2d. Finally, a first connecting electrode 151 connects the source electrode 101 to the source region 121 via the contact holes 141 and 131 and a second connecting electrode 153 connecting the drain electrode 103 to the drain region 123 via the contact holes 143 and 133 are formed, as shown in FIG. 2e.

The fabrication method of the present requires fewer photolithography steps. It is, however, critical to form the source region contact hole 131 and the source electrode contact hole 141 (or the drain region contact hole 133 and the drain electrode contact hole 143) simultaneously. The opening of each contact hole, however, is at a different height and etching the uneven surface is difficult. The source region contact hole 131 is formed by etching through the second insulating layer 112 and the source electrode contact hole 141 is formed by etching through the first insulating layer 102 and the second insulating layer 112, and the depth ratio between the first insulating layer and second insulating layer is typically 1:1.

That is, the narrow process window of the conventional crystalline silicon TFT increases the difficulty of manufacturing. Additionally, the crystallization process window is limited as a result of the metal lines formed prior to crystallization.

Another conventional crystalline silicon TFT manufacturing process reduces the number of photolithography steps by taper etching. However, the process window of this manufacturing process is also limited due to the harsher requirements of tape angles of the source/drain electrodes and complicated crystallization.

Therefore, on the premise that the process window is unlimited and the process complexity is not increased, a crystalline silicon TFT manufacturing process with fewer photolithography steps than the conventional method to decrease manufacturing costs is called for.

SUMMARY OF THE INVENTION

Accordingly, an object of the present invention is to provide a thin film transistor. In the crystalline silicon TFT manufacturing process of the present invention, the gate electrodes act as masks and the source/drain regions are formed using a self-aligned implantation process, and the dielectric layer is defined to form all contact holes through a photolithography step thus eliminating the problem of different contact hole opening heights in the dielectric layer. Moreover, the scan lines and data lines are simultaneously defined in one photolithography step. The present invention only employs four photolithography steps to manufacture the crystalline silicon TFT as described, thereby reducing the photolithography steps of conventional process and avoiding alignment errors, further improving yield and increasing throughput.

Another object of the present invention is to provide a method of fabricating a thin film transistor, only requiring four photolithography steps to manufacture the thin film transistor according to the present invention.

Yet another object of the invention is to provide a method of fabricating a thin film transistor for a transflective display, only requiring five photolithography steps to manufacture the above TFT, and further simplify the process of fabricating a switchable transflective display.

Still another object of the invention is to provide a method of fabricating a CMOS thin film transistor with lightly doped drain structure, only requiring six photolithography steps to manufacture the above TFT, further simplifying the conventional fabricating process.

To achieve the first object, according to the present invention, a thin film transistor comprises a substrate and a patterned semiconductive layer formed on the substrate, wherein the semiconductive layer comprises a channel region and source/drain regions adjacent to the channel region. A gate insulating layer is formed on the above structure. A gate electrode is located on the gate insulating layer above the channel region. Source and drain electrodes are located on the gate insulating layer adjacent to the semiconductive layer. A dielectric layer is formed on the above structure. A plurality of contact holes is defined via the dielectric layer exposing a part of the surface of source/drain regions and electrodes. A patterned conductive layer is formed on predetermined parts of the dielectric layer to electrically connect the source and drain regions to the source and drain electrodes through the contact holes.

Preferably, a conductive layer is etched to form the gate electrode and the source and drain electrodes in one photolithography step.

In another aspect of the invention, the thin film transistor further comprises a buffer layer formed between the semiconductive layer and the substrate.

In order to achieve this object, the present invention provides a method of fabricating a thin film transistor comprising only the four following photolithography steps.

First, a substrate is provided, and a semiconductive layer is formed conformally on the substrate. Next, the semiconductive layer is etched to form a semiconductor island, wherein the semiconductor island comprises a channel region and predetermined source and drain regions adjacent to the channel region.

A gate oxide layer and a first conductive layer are formed sequentially on the substrate and the semiconductor island. The first conductive layer is etched to simultaneously form a gate electrode on the gate oxide layer above the channel region and source/drain electrodes on the respective gate oxide layer adjacent to the semiconductor island.

Next, using the gate electrode as a mask, a self-aligned ion implantation is performed on the predetermined source and drain regions of the semiconductor island to form source/drain regions. A dielectric layer is formed on the above structure, and the dielectric layer is etched to form a plurality of contact holes via the dielectric layer exposing part of the surface of source/drain regions and electrodes.

Finally, a patterned second conductive layer is formed on predetermined parts of the dielectric layer to electrically connect the source and drain regions to the source and drain electrodes through the contact holes.

The present invention also provides a method of fabricating a thin film transistor for a transflective display, requiring only five photolithography steps to manufacture the same. The method comprises the following steps.

First, a substrate with a predetermined transmissive TFT region and a predetermined reflective TFT region is provided. Next, a semiconductive layer is formed on the substrate and etched to form a semiconductor island on the predetermined transmissive TFT region and the predetermined reflective TFT region respectively, wherein the semiconductor island comprises a channel region and predetermined source and drain regions adjacent to the channel region.

Then, a gate oxide layer and a first conductive layer are sequentially formed on the substrate and the semiconductor islands. The first conductive layer is etched to simultaneously form gate electrodes on the gate oxide layer above the channel regions and source and drain electrodes on the respective gate oxide layer adjacent to the channel region.

Next, using the gate electrode as a mask, a self-aligned ion implantation is performed on the predetermined source and drain regions of each semiconductor island to form source/drain regions. A dielectric layer is formed on the above structure and etched to form a plurality of contact holes via the dielectric layer exposing a part of the surface of source/drain regions and electrodes.

Furthermore, a patterned second conductive layer is formed on predetermined parts of the dielectric layer for the predetermined reflective TFT region to electrically connect the source and drain regions to the source and drain electrodes through the contact holes.

Finally, a patterned third conductive layer is also formed on predetermined parts of the dielectric layer for the predetermined transmissive TFT region to electrically connect the source and drain regions to the source and drain electrodes through the contact holes.

Another aspect of the present invention provides a method of fabricating a CMOS thin film transistor with lightly doped drain structure, requiring six photolithography steps to manufacture the same. The method comprises the following steps.

First, a substrate with an n-type MOS TFT region, a p-type TFT region and a LDD region is provided. Next, a semiconductive layer is formed on the substrate and etched to form a first semiconductor island on the n-type MOS TFT region, a second semiconductor island on the p-type MOS TFT region, and the third semiconductor island on the LDD region respectively, wherein each of the first and the second semiconductor island comprises a channel region and predetermined source and drain regions adjacent to the channel region and the third semiconductor islands comprise a channel region, predetermined lightly doped source and drain regions adjacent to the channel region, and predetermined source and drain regions adjacent to the predetermined lightly doped source and drain regions.

Then, a first mask layer is formed on the above structure and patterned to expose the predetermined source and drain regions of the first and third semiconductor islands. Next, using the first mask layer as a mask, a heavily doped n-type ion implantation is performed on the predetermined source and drain regions of the first and third semiconductor islands to form source/drain regions.

Next, a gate oxide layer and a first conductive layer are sequentially formed on the above structure. Next, the first conductive layer is patterned to form gate electrodes located on the gate oxide layer above the channel regions and source and drain electrodes located on the respective gate oxide layer adjacent to the channel region.

Moreover, using the gate electrode above the first semiconductor island as a mask, a lightly doped n-type ion implantation is performed on the predetermined lightly doped source and drain regions of the first semiconductor island to form lightly doped source and drain regions.

Next, a second mask layer is formed on the above structure and patterned to expose the surface of the gate oxide layer above the second semiconductor island.

Then, p-type ion implantation is performed on the predetermined source and drain regions of the second semiconductor island to form source and drain regions, with the gate electrode above the second semiconductor island acting as a mask. A dielectric layer is formed on the above structure and etched to form a plurality of contact holes via the dielectric layer exposing part of the surface of source/drain regions and electrodes.

Finally, a patterned second conductive layer is formed on predetermined parts of the dielectric layer to achieve the electrical connection of the LDD region and the electrical connection of the n-type MOS TFT and the p-type MOS TFT through the contact holes.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention can be more fully understood by reading the subsequent detailed description and examples with references made to the accompanying drawings, which are given by way of illustration only, and thus are not limitative of the present invention, and wherein.

DETAILED DESCRIPTION OF THE INVENTION

The following embodiments are intended to illustrate the invention more fully without limiting their scope, since numerous modifications and variations will be apparent to those skilled in this art.

First Embodiment

FIGS. 3a to 3g show the steps of a method of fabricating a thin film transistor according to the first embodiment of the present invention, wherein the method requires only-four photolithography steps.

Figure 1A:
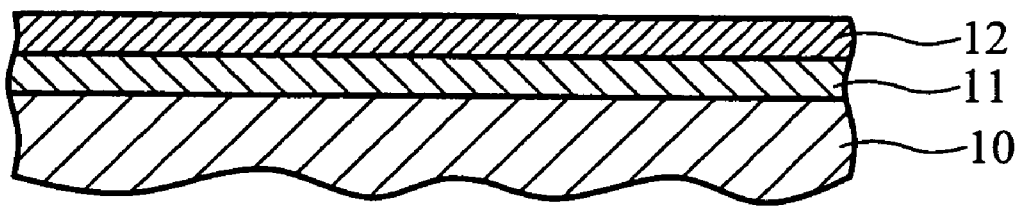
FIGS. 1a to 1h are cross sections of the manufacturing process of a conventional complementary metal-oxide semiconductor.
Figure 1B:
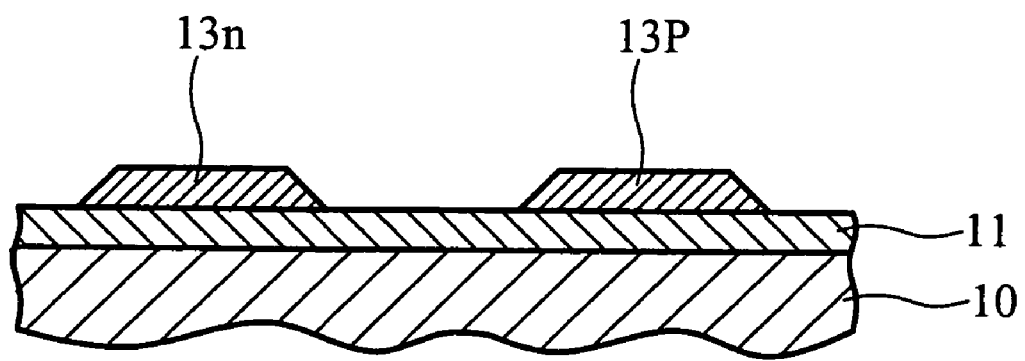
Figure 1C:
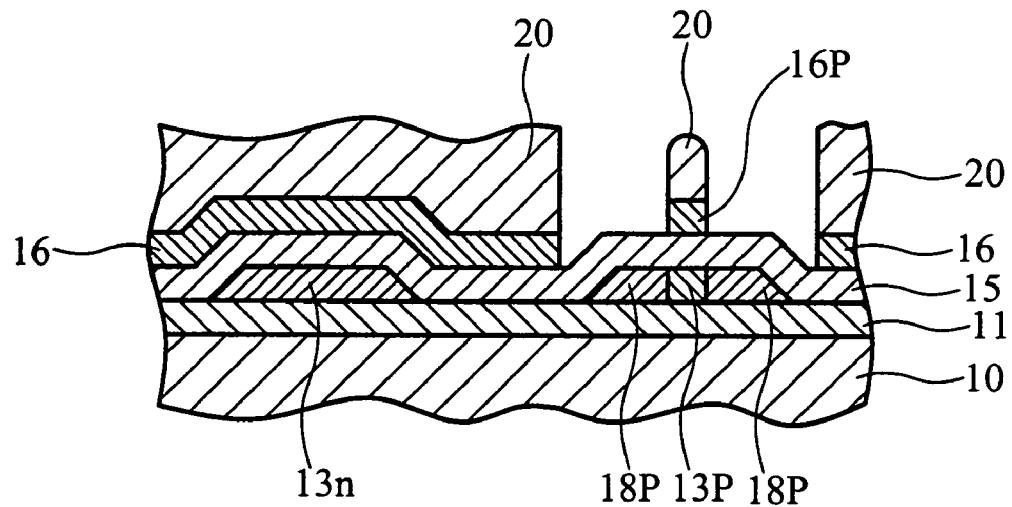
Figure 1D:
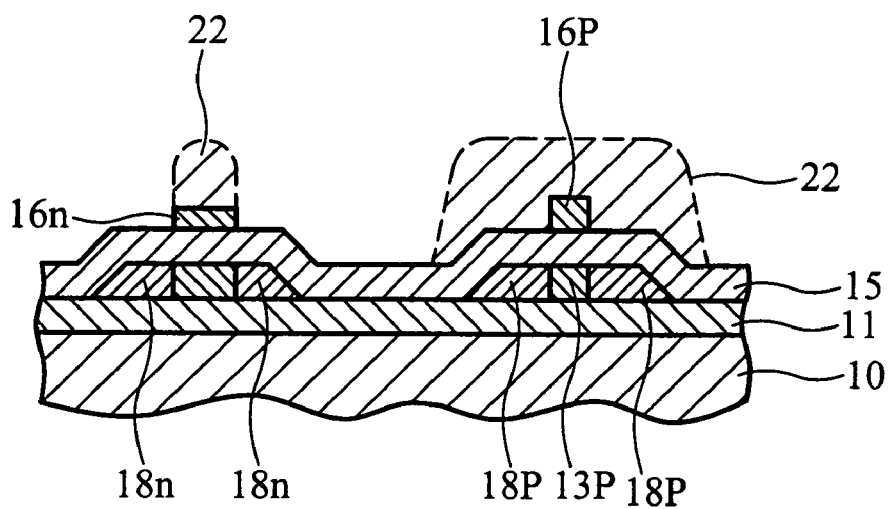
Figure 1E:
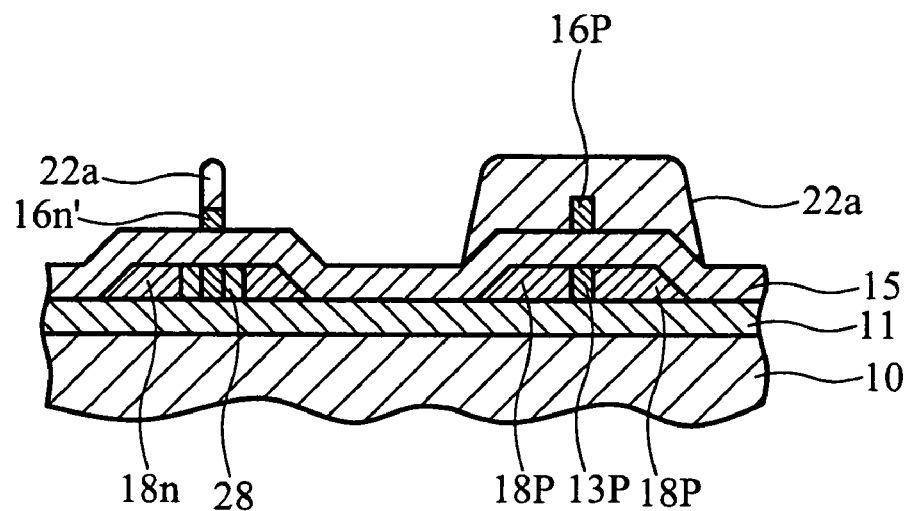
Figure 1F:
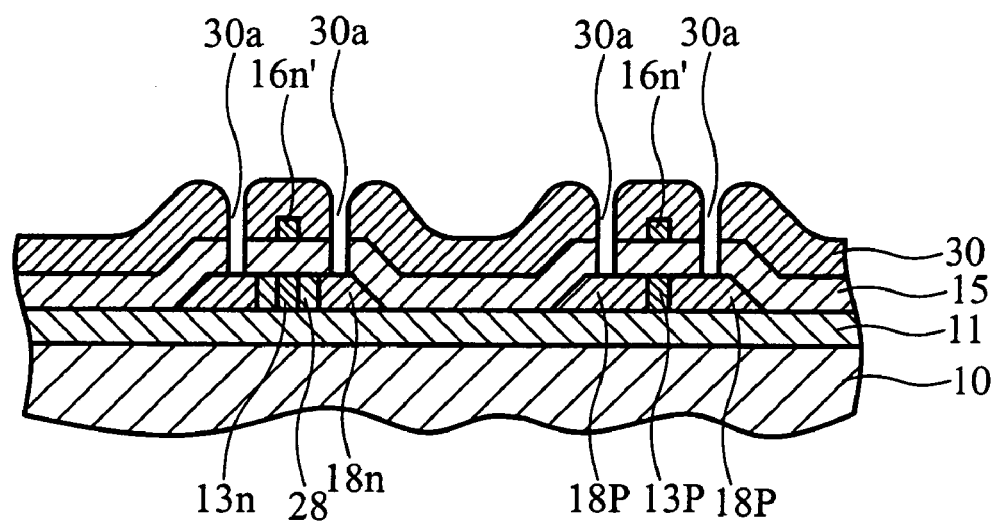
Figure 1G:
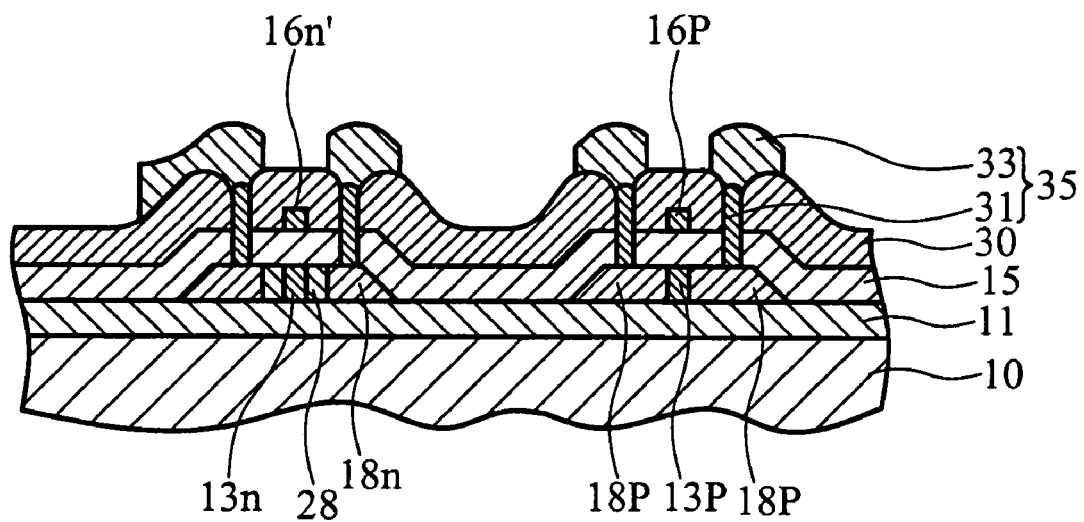
Figure 1H:
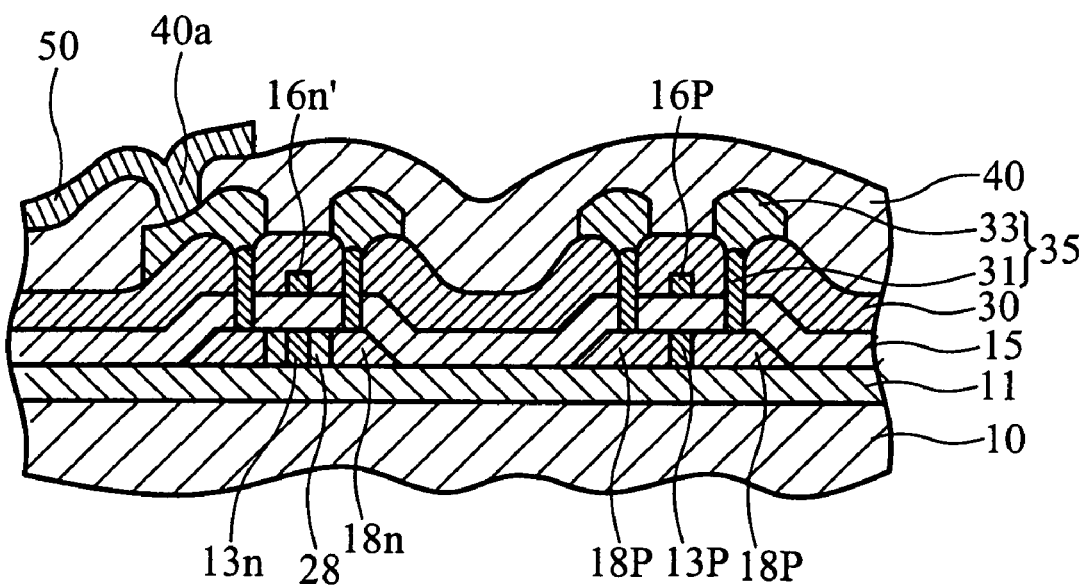
Figure 2A:
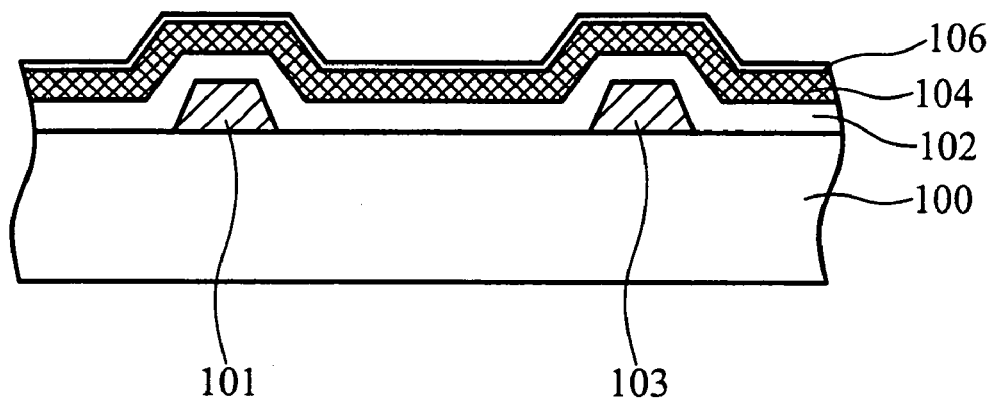
FIGS. 2a to 2e are cross-sections of the manufacturing process of a conventional crystalline silicon TFT.
Figure 2B:
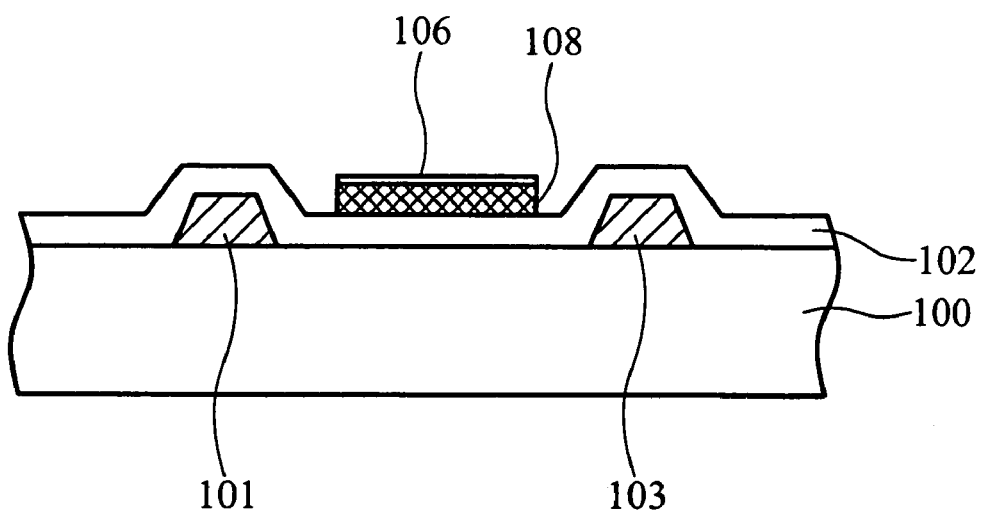
Figure 2C:
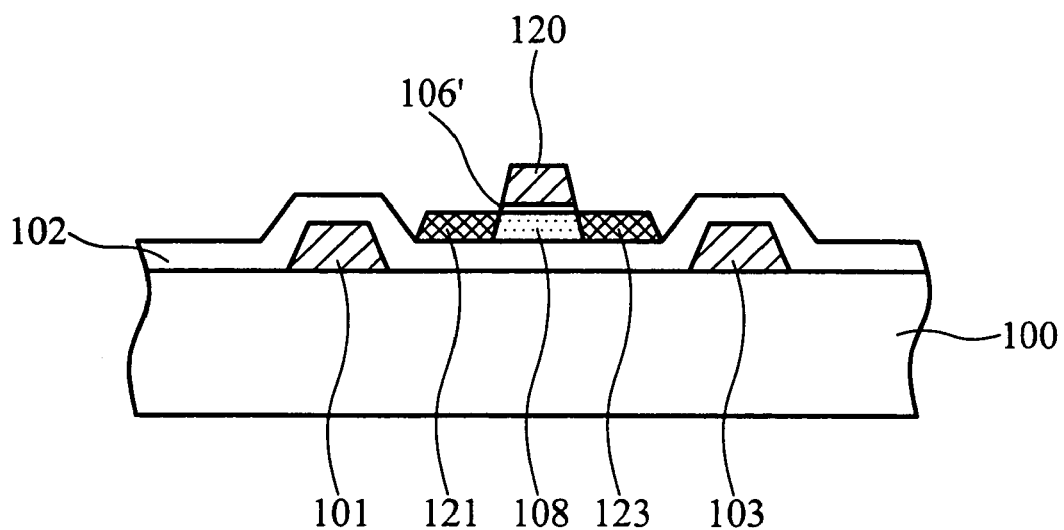
Figure 2D:
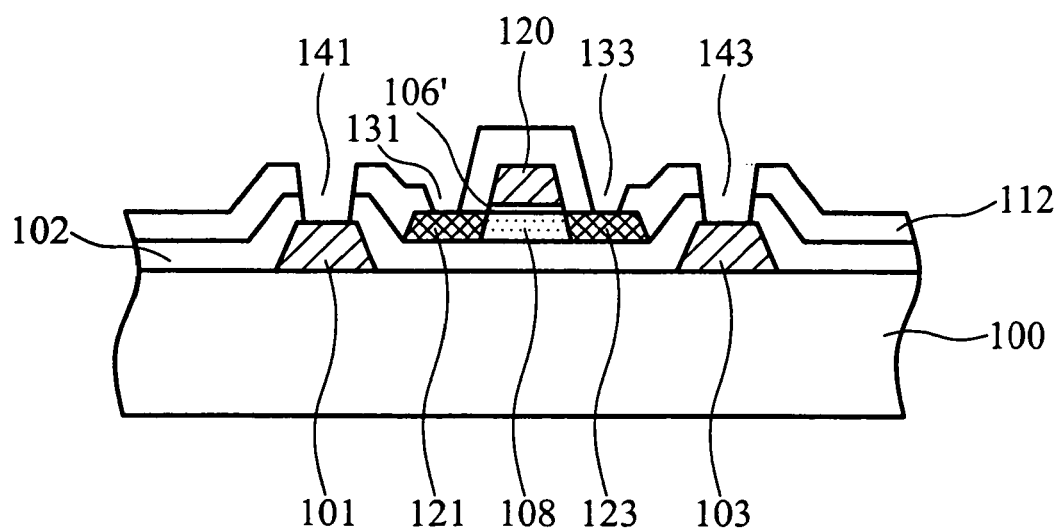
Figure 2E:
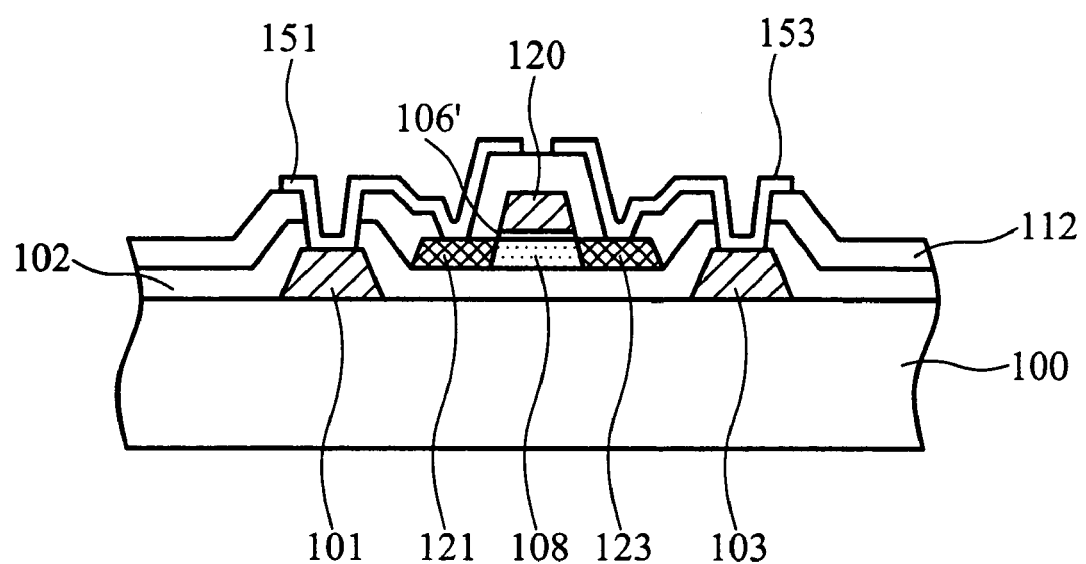
Figure 3A:
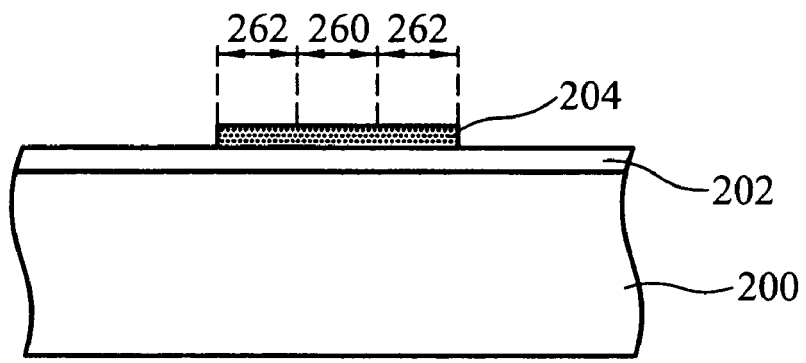
FIGS. 3a to 3g are cross-sections showing the method of fabricating a thin film transistor requiring only four photolithography steps.

First, referring to FIG. 3a, a substrate 200 is provided. A buffer layer 202 and a semiconductive layer are then formed on the substrate 200. Next, the semiconductive layer is defined to form a semiconductor island 204 by a first photolithography step, wherein the semiconductor island comprises a channel region 260 and predetermined source and drain regions 262 adjacent to the channel region 260.

Suitable material for the buffer layer 202 is a silicide, such as silicon nitride. Preferably, the semiconductive layer is a crystalline silicon layer, and methods of forming the crystalline silicon layer are unlimited in the present invention. For example, the method of forming the crystalline silicon layer comprises depositing an amorphous silicon layer followed by thermal application or excimer laser annealing (ELA) to crystallize the amorphous silicon layer through solid or liquid phase growing. In this embodiment, the crystallization step of the amorphous silicon layer precedes formation of inter connects and subsequently formed electrodes resulting in an unlimited process window.

Figure 3B:
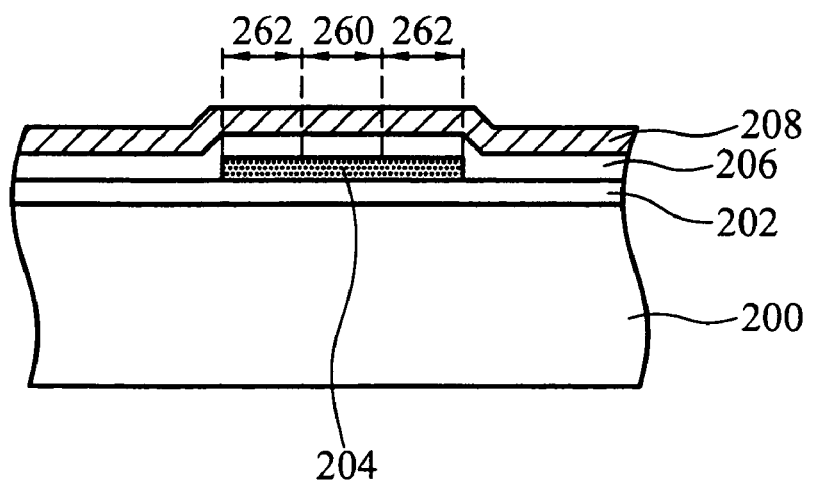

Next, a gate oxide layer 206 and a first conductive layer 208 are sequentially formed on the substrate 200 and the semiconductor island 204, as shown in FIG. 3b.

Preferably, the gate oxide layer 206 such as silicon oxide is formed by sputtering or vapor deposition. The gate oxide layer 206 has a thickness of about 50 nm to 150 nm, preferably 80 nm to 120 nm. To meet the requirements of TFT electrodes, suitable material of the first conductive layer 208 is Al, Ti, Ta, Cr, Mo, MoW or alloys thereof, and the first conductive layer 208 is formed by, for example, sputtering or vacuum evaporation.

Sequentially, the first conductive layer 208 is patterned to simultaneously form a gate electrode 220 on the gate oxide layer 206 above the channel region 260 and source electrode 201 and drain electrode 203 on the respective gate oxide layer adjacent to the semiconductor island 204 by a second photolithography step. Due to simultaneous formation of the gate, source and drain electrodes in the same photolithography step Thus the method of the present invention improves upon the prior art by reducing the total number of required photolithography steps by one.

Figure 3C:
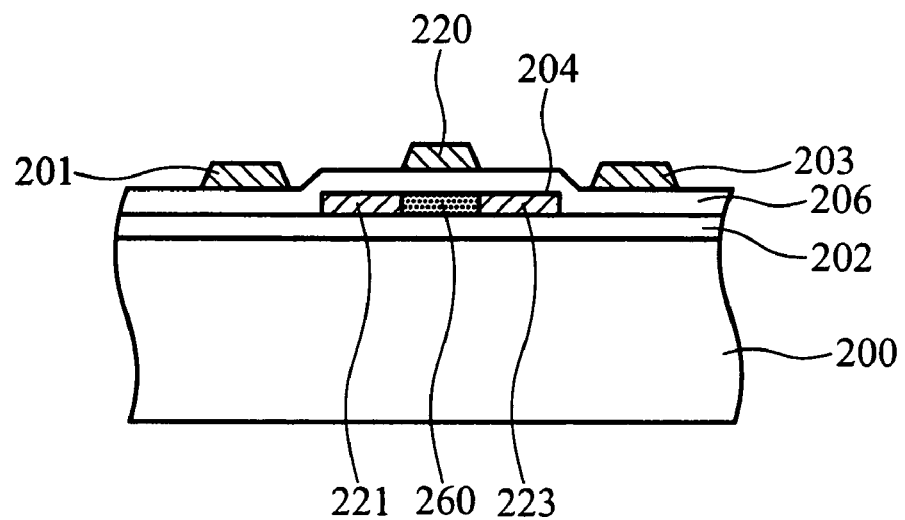

Furthermore, a self-aligned ion implantation is performed on the predetermined source and drain regions 262 of the semiconductor island 204 to form source/drain regions 221 and 223, using the gate electrode as a mask, and the channel region 260 is not implanted as it is masked by the gate electrode 220 thereupon, as shown in FIG. 3c. The predetermined implanted region need not be defined by an extra mask due to the self-aligned ion implantation. The dimension of gate electrode 220 is not less than that of the channel region 260. The shape of electrode is illustrated as an example, and thus not intended to be limitative of the present invention.

Figure 3D:
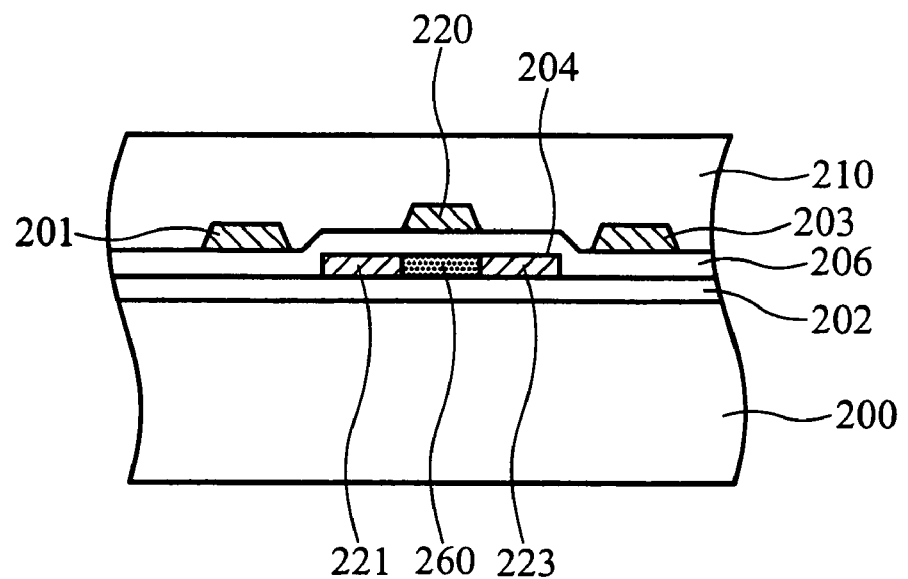

Next, referring to FIG. 3d, a dielectric layer 210 is formed conformally on the above structure, wherein the material of the dielectric layer 210 may be the same as the gate oxide layer 204, such as silicon oxide. Preferably, the dielectric layer 210 has a thickness about 300 nm to 3000 nm, and can be formed by vapor deposition. The dielectric layer is etched to form a plurality of contact holes via the dielectric layer exposing a part of the surface of source/drain regions and electrodes. The thickness ratio between the dielectric layer and the gate oxide is about 6:1, and is preferably 10:1.

Figure 3E:
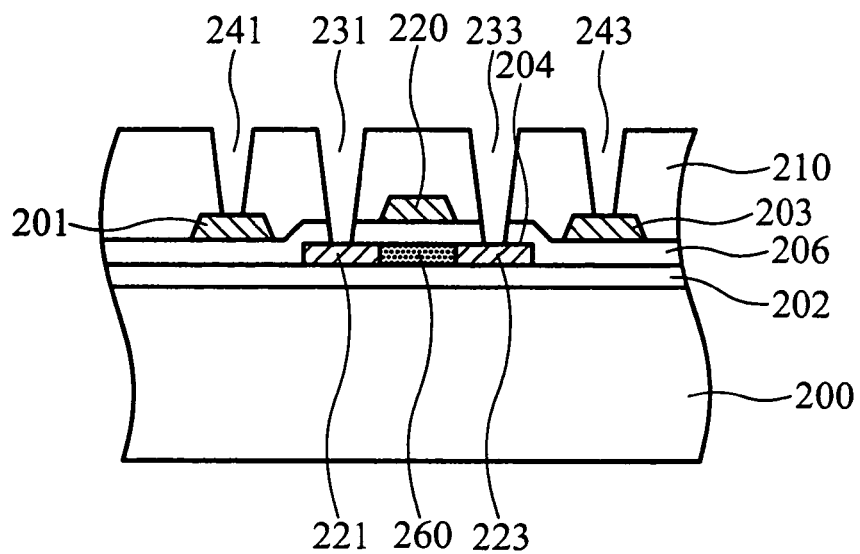

Referring next to FIG. 3e, the dielectric layer 210 is then patterned to form a plurality of contact holes via the dielectric layer 210 exposing part of the surface of each source/drain regions and electrodes with a third photolithography step.

Particularly, the source electrode contact hole 241 and drain electrode contact hole 243 are formed exposing the top surface of source electrode 201 and drain electrode 203 respectively by etching through the dielectric layer 210, and the source region contact hole 231 and drain region contact hole 233 are formed exposing the top surface of source region 221 and drain region 223 respectively by etching through the dielectric layer 210 and the gate oxide layer 206. Thus, by forming the contact holes of source/drain regions and electrodes in the same photolithography step, the present method improves upon the prior art by reducing the total number of required photolithography steps by one The process of etching the contact holes in the present invention is more easily controlled than in the conventional method, as the dielectric layer 210 is far thicker than the gate oxide layer 206, even through the different etching depths required by the different heights of the contact hole openings of the source/drain regions and electrodes.

Figure 3F:
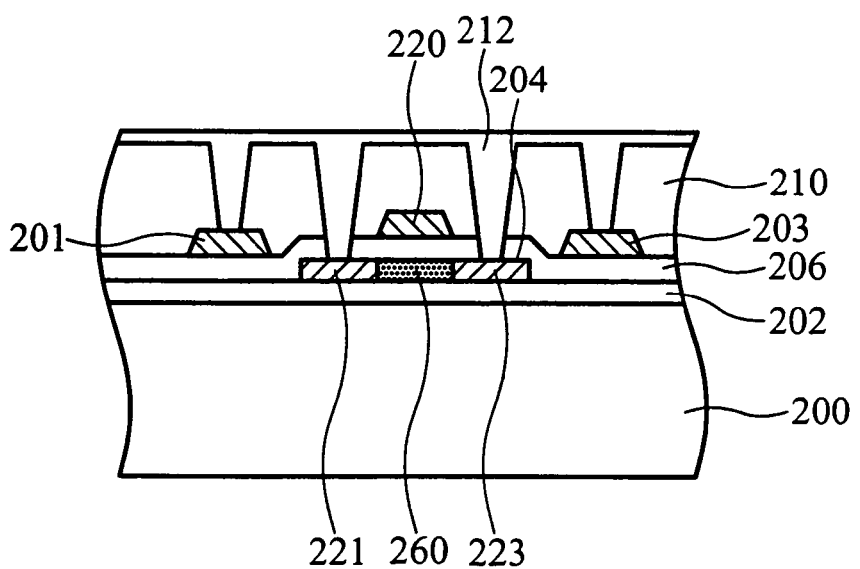
Figure 3G:
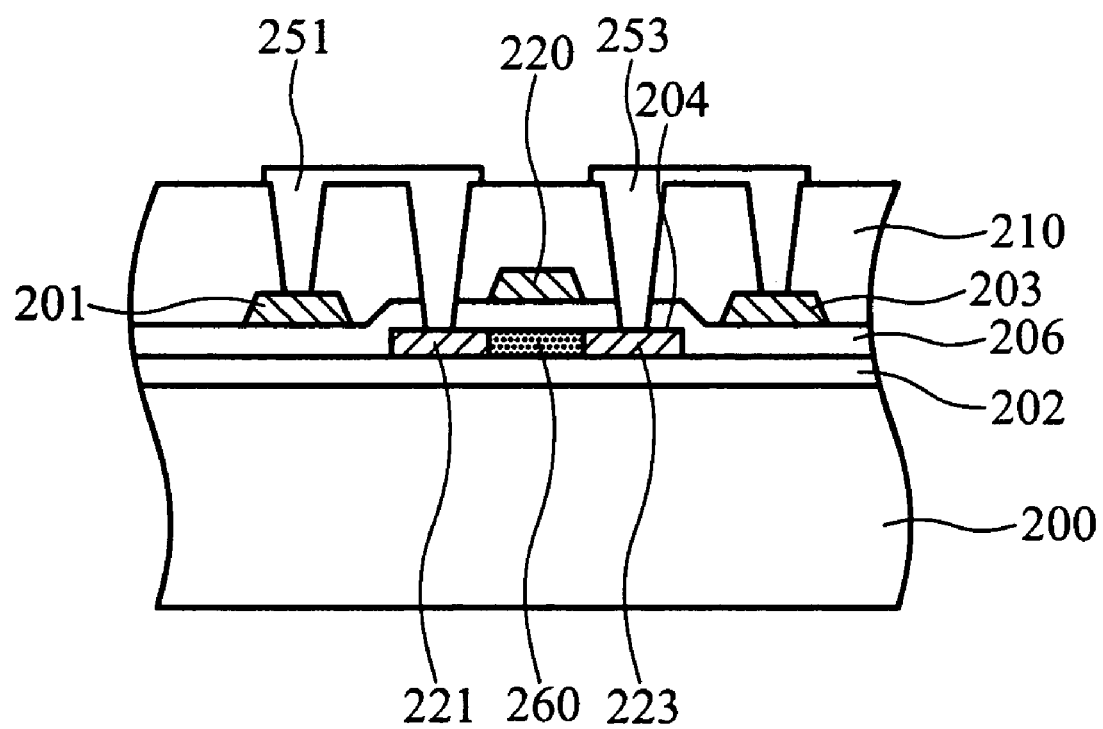

Referring to FIG. 3f, a second conductive layer 212 is sequentially formed on the dielectric layer and filled into the contact holes contacting the source/drain regions and electrodes, then the second conductive layer 212 is patterned by a photolithography so that the source region 221 is electrically connected to the source electrode 201 and the drain region 223 is electrically connected to the drain electrode 203, as shown in FIG. 3g, thus fabrication of thin film transistor is completed, requiring only four photolithography steps according to the first embodiment.

Second Embodiment

FIGS. 4a to 4g show the steps of a method of fabricating a thin film transistor for a transflective display according to the second embodiment of the present invention, wherein the method only employs five photolithography steps.

Figure 4A:
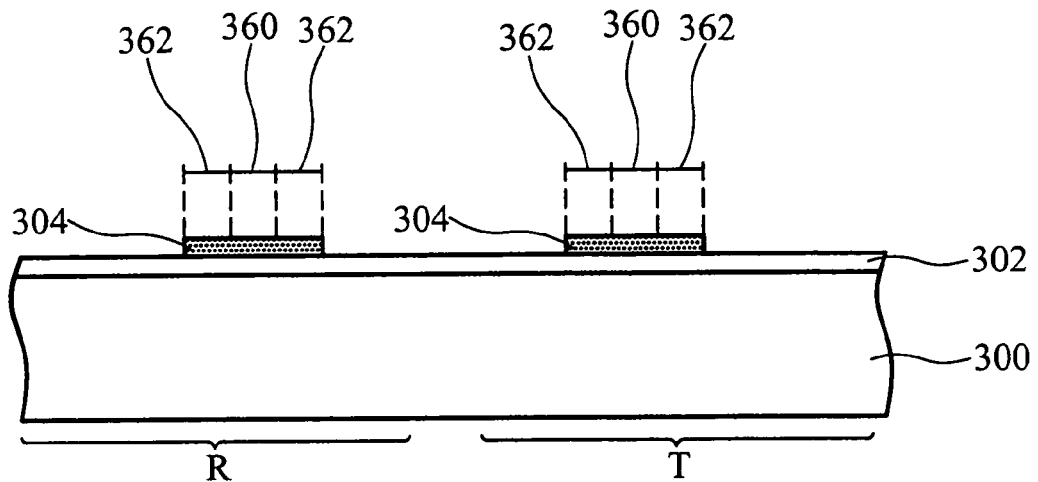
FIGS. 4a to 4g are cross-sections showing the method of fabricating a thin film transistor for a transflective display requiring only five photolithography steps.

First, referring to FIG. 4a, a substrate 300 with a predetermined transmissive TFT region T and a predetermined reflective TFT region R is provided. A buffer layer 302 and a semiconductive layer are then formed on the substrate 300. Next, the semiconductive layer is defined to form a semiconductor island 304 on the predetermined transmissive TFT region and another on the predetermined reflective TFT region by a first photolithography step, wherein each semiconductor island comprises a channel region 360 and predetermined source and drain regions 362 adjacent to the channel region 360.

Suitable material for the buffer layer 302 is a silicide, such as silicon nitride. Preferably, the semiconductive layer is a crystalline silicon layer, and methods of forming the crystalline silicon layer are unlimited in the present invention.

Figure 4B:
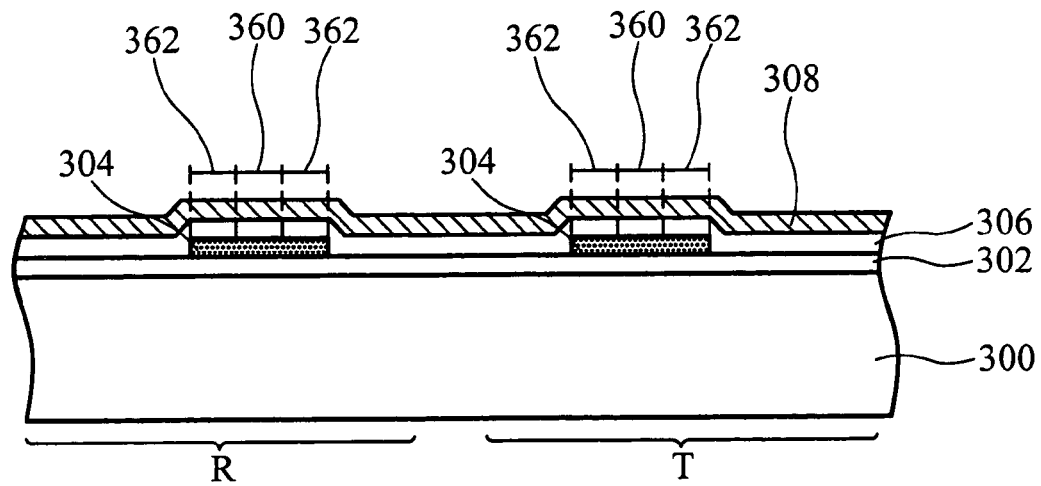

A gate oxide layer 306 and a first conductive layer 308 are then sequentially formed on the substrate 300 and the semiconductor island 304, as shown in FIG. 4b. The gate oxide layer 306 such as silicon oxide is formed and has a thickness of about 50 nm to 150 nm, preferably 80 nm to 120 nm.

Figure 4C:
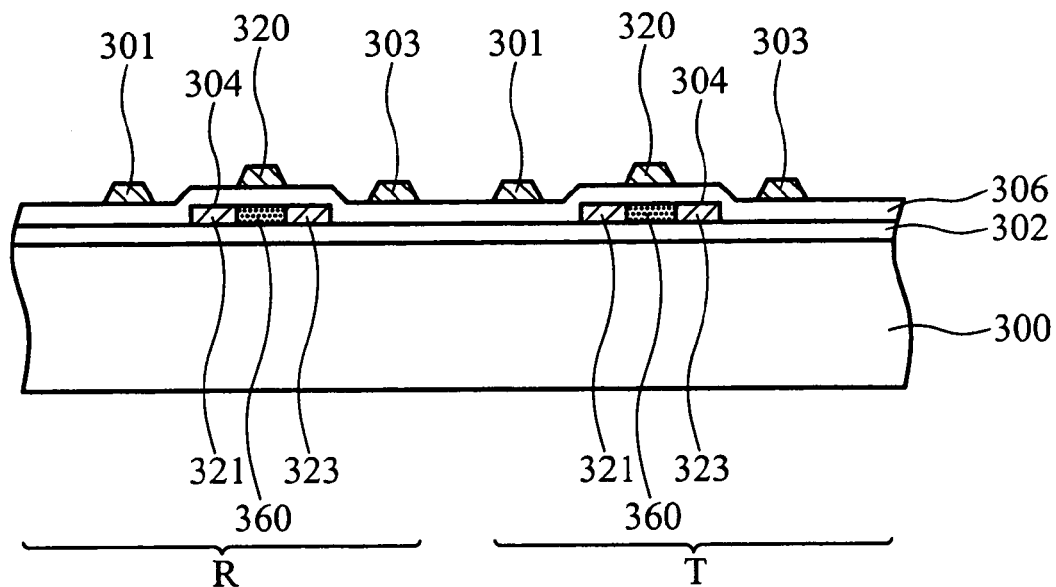

The first conductive layer 308 is then patterned to simultaneously form gate electrodes 320 on the gate oxide layer 306 above each channel region 360 and source electrodes 301 and drain electrodes 303 on the respective gate oxide layer surface adjacent to each semiconductor island 304 by a second photolithography step. Due to simultaneous formation of the gate, source and drain electrodes in the same photolithography step, the number of photolithography steps required is reduced by one over the conventional method Furthermore, a self-aligned ion implantation is performed on the predetermined source and drain regions 362 of the semiconductor island 304 to form source/drain regions 321 and 323, using the gate electrodes as masks, and the channel regions 360 are not implanted resulting from the gate electrodes 320 thereupon, as shown in FIG. 4c.

Figure 4D:
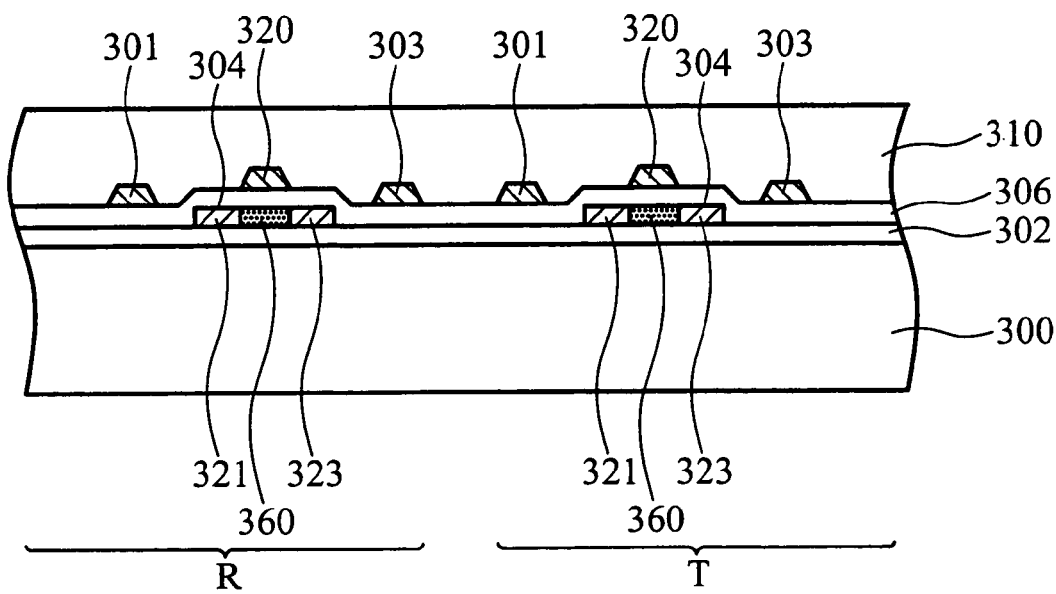

Sequentially, referring to FIG. 4d, a dielectric layer 310 is blanketly formed on the above structure, wherein the material of the dielectric layer 310 may be the same with the gate oxide layer 306. According to the first embodiment, the dielectric layer 310 may have a thickness about 300 nm to 3000 nm, and the thickness ratio of the dielectric layer to the gate oxide is about 6:1, preferably 10:1.

Figure 4E:
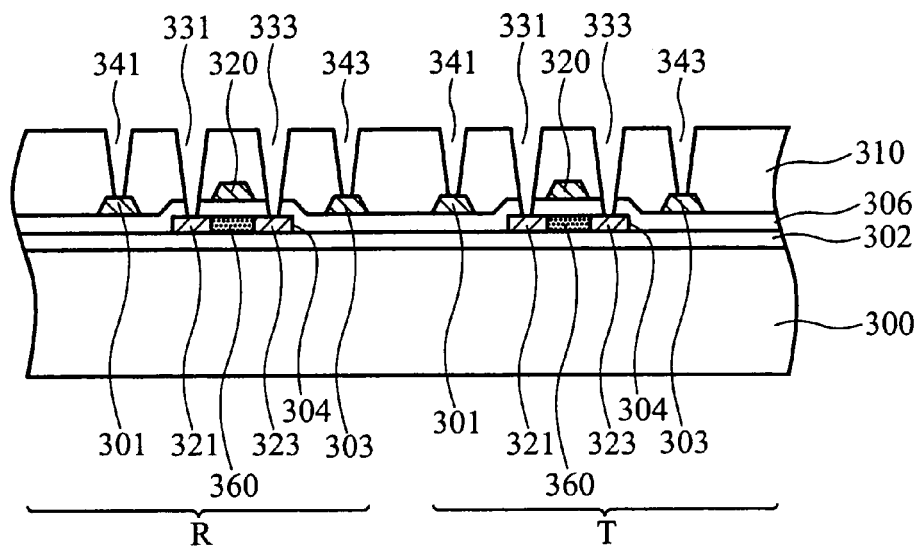

Referring to FIG. 4e, the dielectric layer 310 and gate oxide layer 306 are sequentially patterned to form a plurality of contact holes exposing part of the surface of each source/drain region and electrodes by a third photolithography step.

Particularly, the source electrode contact hole 341 and drain electrode contact hole 343 are formed exposing the top surface of source electrode 301 and drain electrode 303 respectively by etching through the dielectric layer 310, and the source region contact hole 331 and drain region contact hole 333 are formed exposing the top surface of source region 321 and drain region 323 respectively by etching through the dielectric layer 310 and the gate oxide layer 306.

Figure 4F:
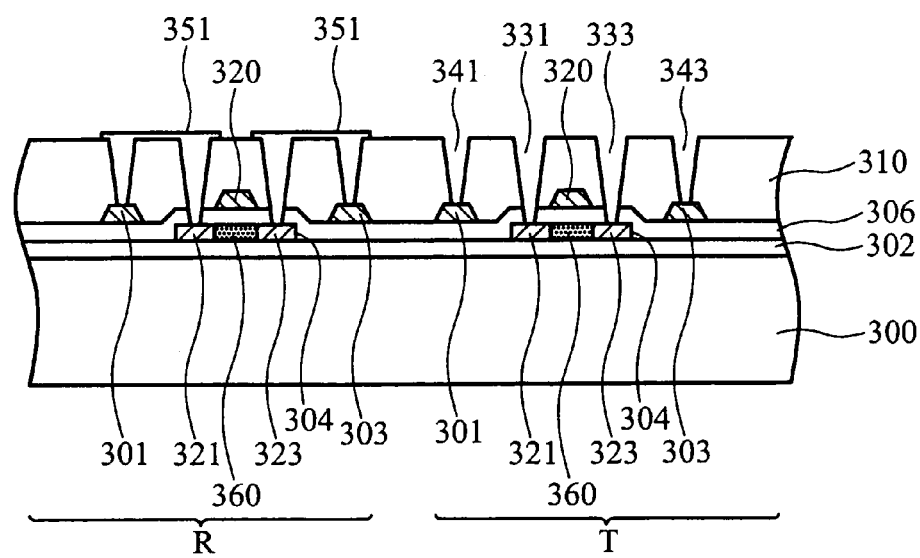

Next, referring to FIG. 4f, a second conductive layer 351 is formed on the dielectric layer 310 of the predetermined reflective TFT region R and filled into the contact holes thereof contacting the source/drain regions and electrodes. Then, the second conductive layer 312 is patterned by a fourth photolithography step so that the source region 321 is electrically connected to the source electrode 301 and the drain region 323 is electrically connected to the drain electrode 303 in the predetermined reflective TFT region R. Suitable material for the second conductive layer 351 is metal or alloy which can reflect incident light.

Figure 4G:
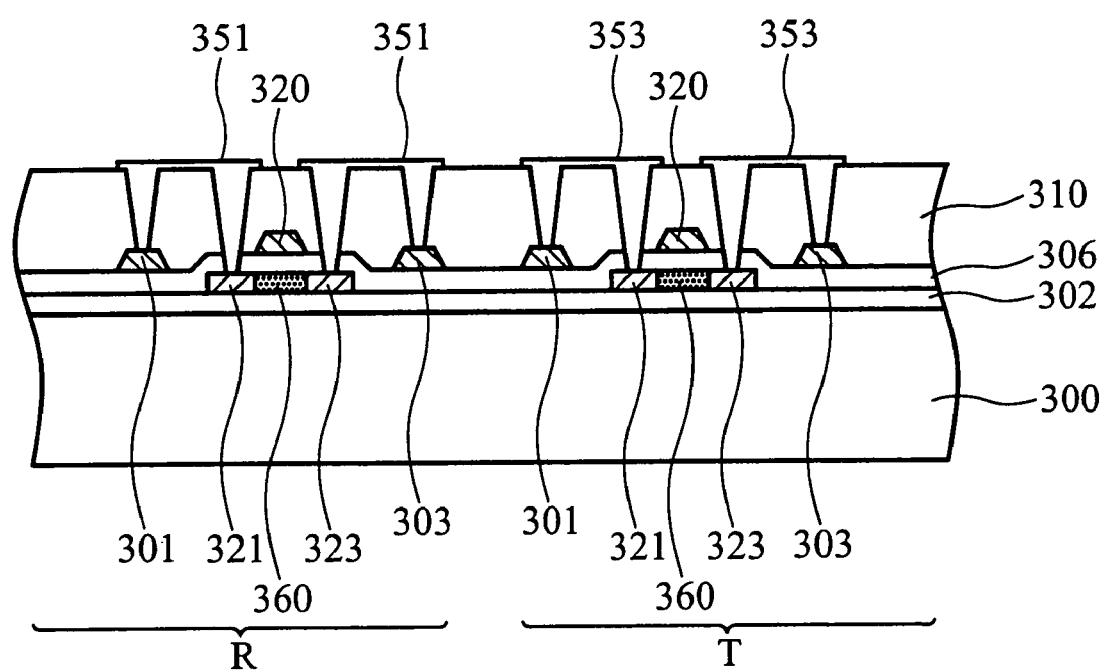

Finally, referring to FIG. 4g, a third conductive layer 353 is formed on the dielectric layer 310 of the predetermined transmissive TFT region T and patterned to make electrical connection thereof through a fifth photolithography step, thus completing fabrication of the thin film transistor for a transflective display with only five photolithography steps. Suitable material for the third conductive layer 353 is a transparent conductor which can allow the pass of light emitted from backlight.

Third Embodiment

FIGS. 5a to 5g show the steps of a method of fabricating a CMOS thin film transistor with lightly doped drain structure according to the third embodiment of the present invention, wherein the method only employs six photolithography steps.

Figure 5A:
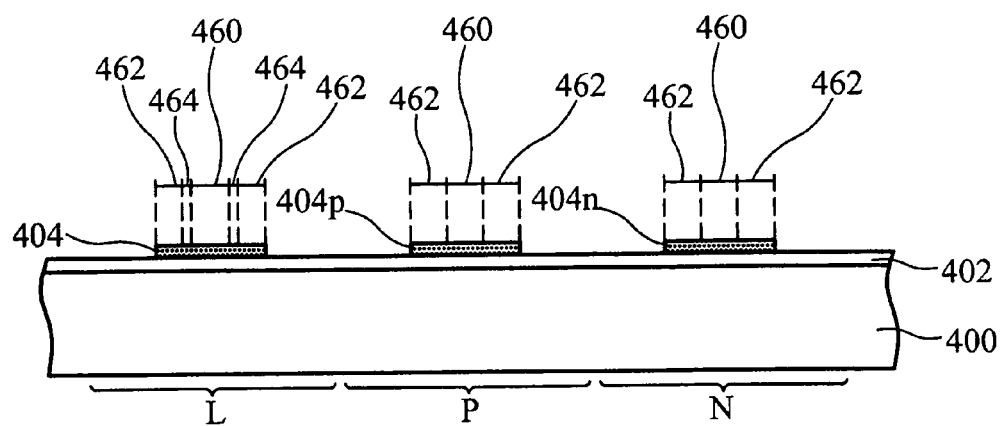
FIGS. 5a to 5g are cross-sections showing the method of fabricating a CMOS thin film transistor with lightly doped drain structure requiring only six photolithography steps.

First, referring to FIG. 5a, a substrate 400 with a n-type MOS TFT region N, a p-type MOS TFT region P and an LDD region L is provided. Next, a buffer layer 402 and a semiconductive layer are formed on the substrate 400. The semiconductive layer is then patterned to form a first semiconductor island 404 on the LDD region L, a second semiconductor island 404p on the p-type MOS TFT region P, and the third semiconductor island 404n on the n-type MOS TFT region N respectively by a first photolithography step, wherein each of the second and third semiconductor islands comprise a channel region 460 and predetermined source and drain regions 462 adjacent to the channel region 460 and the first semiconductor island 404 comprises a channel region 460, predetermined lightly doped source and drain regions 464 adjacent to the channel region 460, and predetermined source and drain regions 462 adjacent to the predetermined lightly doped source and drain regions 464.

Preferably, referring to FIG. 5a, the semiconductive layer is a crystalline silicon layer, and methods of forming the crystalline silicon layer are unlimited in the present invention.

Figure 5B:
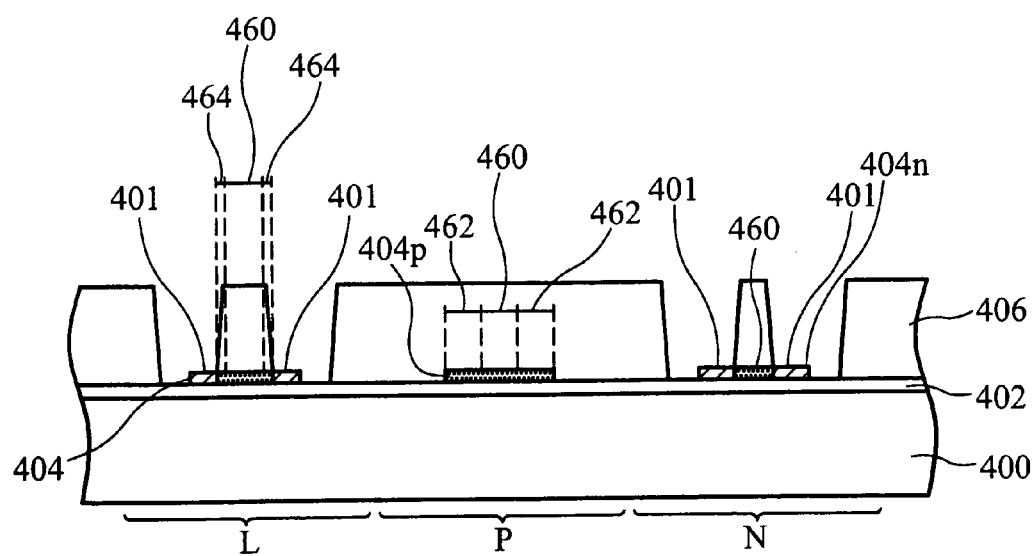

Then, referring to FIG. 5b, a first mask layer 406 is formed on the above structure and patterned to exposing the predetermined source and drain regions 462 of the first and third semiconductor islands 404 and 404n. Next, using the first mask layer 406 as a mask, a heavily doped n-type ion implantation is performed on the predetermined source and drain regions of the first and third semiconductor islands to form source/drain regions 401.

Figure 5C:
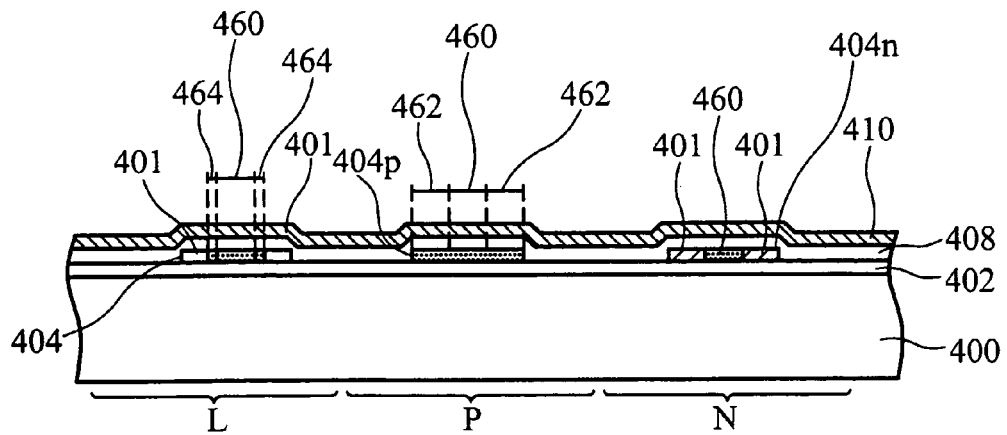

Referring next to FIG. 5c, the first mask layer is removed by any appropriate method, and a gate oxide layer 408 and a first conductive layer 410 is sequentially formed on the above structure. Suitable material of the gate oxide layer 408 and the first conductive layer 410 is disclosed in the above embodiments.

The first conductive layer 410 is then patterned to form a plurality of gate electrodes 420 and source/drain electrodes 413 by a third photolithography step. Particularly, each of the gate electrodes 420 is located on the gate oxide layer 408 above the channel region 460 of each semiconductor island, and the source/drain electrodes 413 are located respectively on the gate oxide layer adjacent to the channel region 460.

Figure 5D:
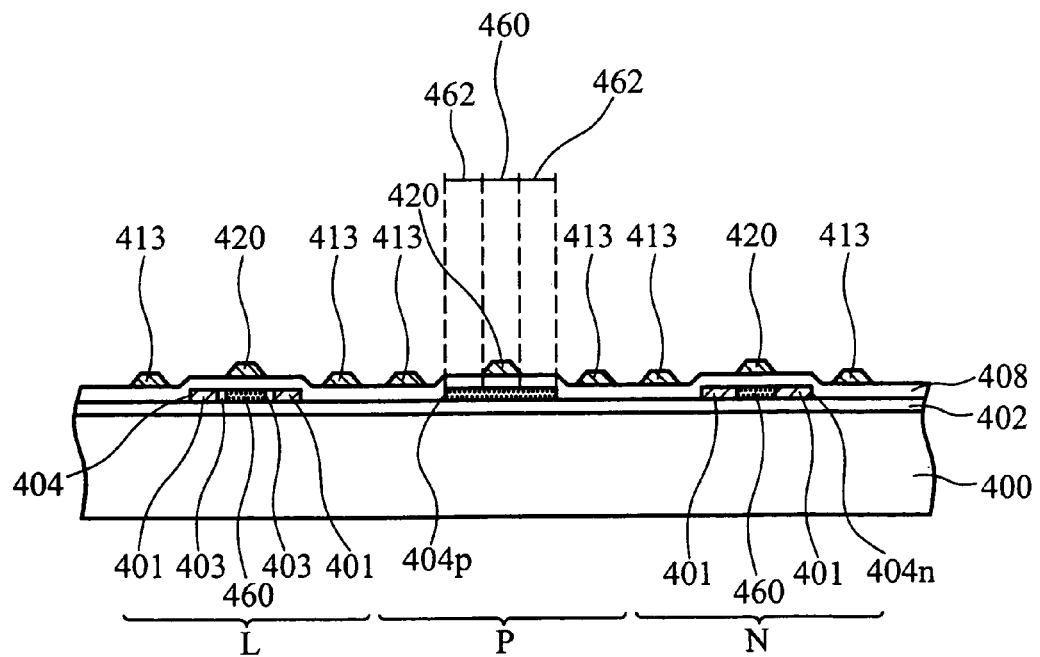

Moreover, using the gate electrode 420 above the first semiconductor island 404 as a mask, a self-aligned lightly doped n-type ion implantation is performed on the predetermined lightly doped source and drain regions 464 of the first semiconductor island 404 to form lightly doped source and drain regions 403, as shown in FIG. 5d. Preferably, the ion dosage of the heavily doped n-type ion implantation is greater than tenfold that of the lightly doped n-type ion implantation.

Figure 5E:
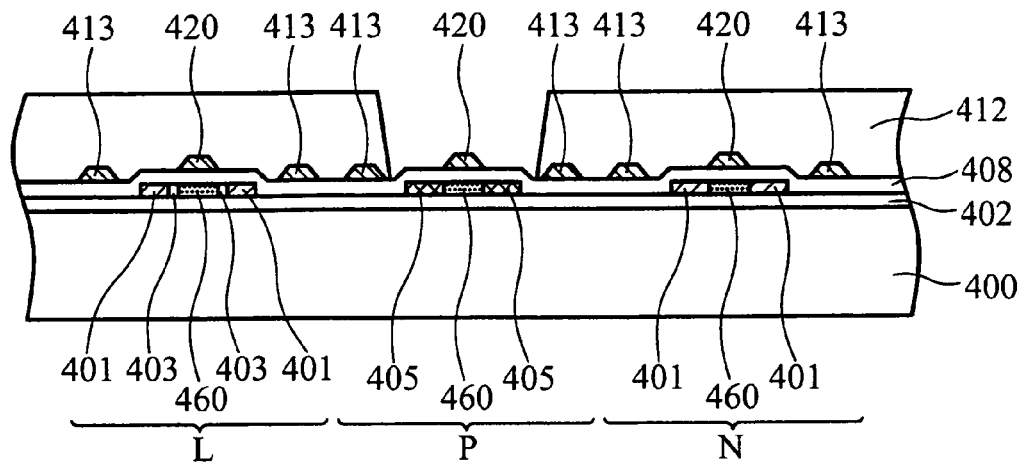

Referring next to FIG. 5e, a second mask layer 412 is blanketly formed on the above structure, and then patterned to expose the surface of the gate oxide layer 408 above the second semiconductor island 404p by a fourth photolithography step.

A p-type ion implantation is then performed on the predetermined source and drain regions 462 of the second semiconductor island 404p to form source and drain regions 405, with the gate electrode 420 above the second semiconductor island 404p acting as a mask.

Figure 5F:
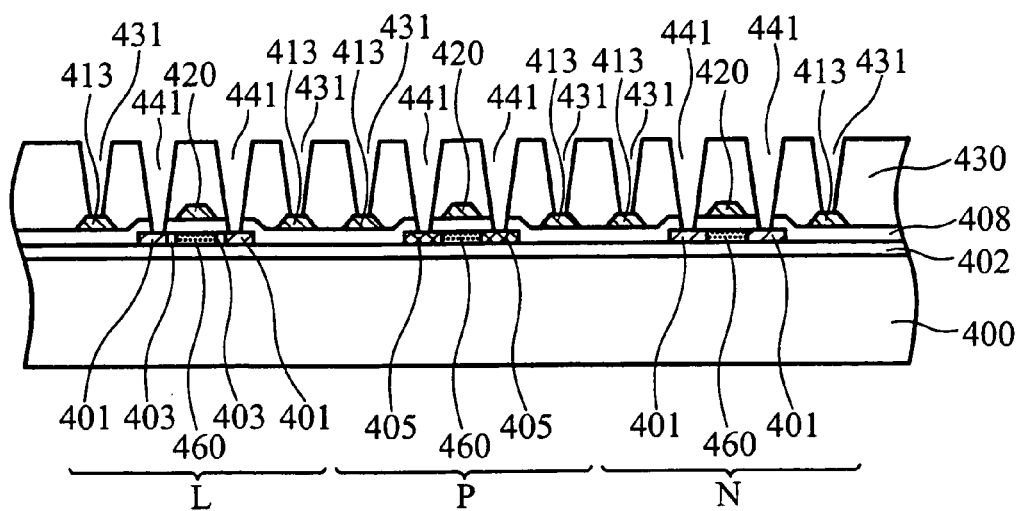

Furthermore, referring to FIG. 5f, after entirely removing the second mask layer 412, a dielectric layer 430 is formed on the above structure, and the gate oxide layer 408 and the dielectric layer 430 are patterned to form a plurality of contact holes exposing part of the surface of each source/drain regions and electrodes by a fifth photolithography step.

Particularly, the source/drain electrode contact holes 431 are formed exposing the top surface of source/drain electrodes 413 by etching through the dielectric layer 430, and the source/drain region contact holes 441 are formed exposing the top surface of the source region and drain region respectively by etching through the dielectric layer 430 and the gate oxide layer 408.

Figure 5G:
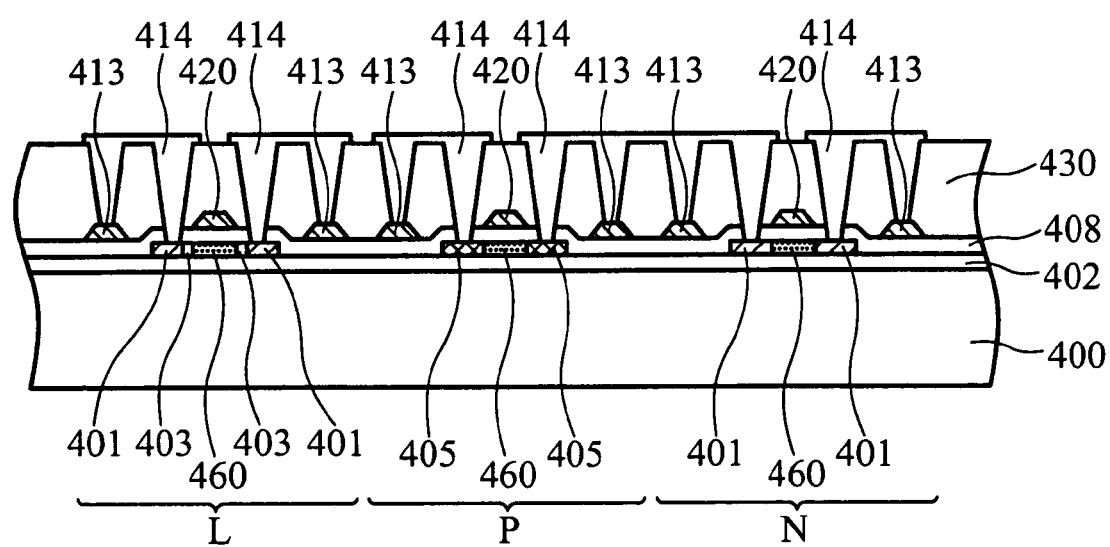

Finally, referring to FIG. 5g, a second conductive layer 414 is formed on the dielectric layer and filled into the contact holes contacting the source/drain regions and electrodes. The second conductive layer 414 is then patterned by a sixth photolithography step to achieve the electrical connection of the LDD source and the electrical connection of the n-type MOS TFT and the p-type MOS TFT through the contact holes, thus completing the fabrication of CMOS thin film transistor with LDD structure with six photolithography steps according to the third embodiment.

Due to the simultaneous formation of the gate, source, and drain electrodes in the same photolithography step present invention reduces by one the total number of photolithography steps required by the conventional TFT fabrication process.

Furthermore, another photolithography step is also eliminated in the present invention by the use of self-aligned implantation with the gate electrode acting as a mask.

The process of etching the contact holes in the present invention is more easily controlled than in the conventional method, as the dielectric layer is far thicker than the gate oxide layer. Accordingly, the process window of present invention is unlimited.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method of fabricating a thin film transistor, requiring only four photolithography steps, comprising:
   providing a substrate;
   forming a semiconductive layer on the substrate;
   patterning the semiconductive layer to form a semiconductor island, wherein the semiconductor island comprises a channel region and predetermined source and drain regions adjacent to the channel region;

forming a gate insulating layer and a first conductive layer sequentially on the substrate and the semiconductor island;

patterning the first conductive layer to simultaneously form a gate electrode on the gate insulating layer above the channel region and source/drain electrodes on the respective gate insulating layer adjacent to the semiconductor island;

using the gate electrode as a mask to perform a self-aligned ion implantation on the predetermined source and drain regions to form source/drain regions;

forming a dielectric layer on the gate insulating layer, the gate electrode, and the source and drain electrodes;

patterning the dielectric layer to form a plurality of contact holes via the dielectric layer and the gate insulating layer exposing part of the surface of source/drain regions and electrodes; and forming a patterned second conductive layer on predetermined parts of the dielectric layer to electrically connect the source and drain regions to the source and drain electrodes through the contact holes.

2. The method as claimed in claim 1, further comprising, before forming the semiconductive layer on the substrate, forming a buffer layer on the substrate.

3. The method as claimed in claim 1, wherein the semiconductive layer is a crystalline silicon layer.

4. The method as claimed in claim 3, wherein the method of forming crystalline silicon layer comprises:
forming an amorphous silicon layer on the substrate; and
crystallizing the amorphous silicon layer to form the crystalline silicon layer by thermal application or excimer laser annealing (ELA) through solid or liquid phase growing.

5. The method as claimed in claim 1, wherein the thickness of the gate insulating layer is 50 nm to 150 nm.

6. The method as claimed in claim 1, wherein the thickness of the dielectric layer is 300 nm to 3000 nm 7. The method as claimed in claim 1, wherein the plurality of contact holes is formed simultaneously in one photolithography step 8. A method of fabricating a thin film transistor for transflective display employed five photolithography steps, comprising:
providing a substrate with a predetermined transmissive TFT region and a predetermined reflective TFT region;
forming a semiconductive layer on the substrate;
patterning the semiconductive layer to form a semiconductor island on the predetermined transmissive TFT region and the predetermined reflective TFT region respectively, wherein the semiconductor island comprises a channel region and predetermined source and drain regions adjacent to the channel region;
forming a gate insulating layer and a first conductive layer sequentially on the substrate and the semiconductor islands;
patterning the first conductive layer to simultaneously form gate electrodes on the gate insulating layer above the channel regions and source/drain electrodes on the respective gate insulating layer adjacent to the semiconductor islands;
using the gate electrodes as masks to perform a self-aligned ion implantation on the predetermined source and drain regions to form source/drain regions;
forming a dielectric layer on the gate insulating layer, the gate electrodes, and the source and drain electrodes;
patterning the dielectric layer to form a plurality of contact holes via the dielectric layer and the gate insulating layer exposing part of the surface of source/drain regions and electrodes;

forming a patterned second conductive layer on predetermined parts of the dielectric layer for the predetermined transmissive TFT region to electrically connect the source and drain regions to the source and drain electrodes through the contact holes; and forming a patterned third conductive layer on predetermined parts of the dielectric layer for the predetermined reflective TFT region to electrically connect the source and drain regions to the source and drain electrodes through the contact holes.

9. The method as claimed in claim 8, further comprising, before forming the semiconductive layer on the substrate, forming a buffer layer on the substrate.

10. The method as claimed in claim 8, wherein the semiconductive layer is a crystalline silicon layer.

11. The method as claimed in claim 10, wherein the method of forming the crystalline silicon layer comprises:
forming an amorphous silicon layer on the substrate; and
crystallizing the amorphous silicon layer to form the crystalline silicon layer by thermal application or excimer laser annealing (ELA) through a solid or liquid phase growing.

12. The method as claimed in claim 8, wherein the thickness of the gate insulating layer is 50 nm to 150 nm.

13. The method as claimed in claim 8, wherein the thickness of the dielectric layer is 300 nm to 3000 nm.

14. The method as claimed in claim 8, wherein the plurality of contact holes is formed simultaneously by one photolithography step.

15. A method of fabricating a CMOS thin film transistor with lightly doped drain structure, requiring only six photolithography steps, comprising:
providing a substrate with an n-type MOS TFT region, a p-type TFT region and a LDD region;
forming a semiconductive layer on the substrate;
patterning the semiconductive layer to form a first semiconductor island on the n-type MOS TFT region, a second semiconductor island on the p-type MOS TFT region, and the third semiconductor island on the LDD region respectively, wherein each of the second and third semiconductor island comprises a channel region and predetermined source and drain regions adjacent to the channel region and the first semiconductor islands comprise a channel region, predetermined lightly doped source and drain regions adjacent to the channel region, and predetermined source and drain regions adjacent to the predetermined lightly doped source and drain regions;
forming a patterned first mask layer to exposing the predetermined source and drain regions of the first and third semiconductor islands;
using the first mask layer as a mask to perform a heavily doped n-type ion implantation on the predetermined source and drain regions of the first and third semiconductor islands to form source/drain regions.
forming a gate oxide layer and a first conductor sequentially on the substrate and all semiconductor islands;
patterning the first conductive layer to form gate electrodes located on the gate oxide layer above the channel regions and source and drain electrodes located on the respective gate oxide layer adjacent to the channel region;
using the gate electrode above the first semiconductor island as a mask to perform a lightly doped n-type ion implantation on the predetermined lightly doped source and drain regions of the first semiconductor island to form lightly doped source and drain regions;

forming a patterned second mask layer to expose the surface of the gate oxide layer above the second semiconductor island;

performing a p-type ion implantation on the predetermined source and drain regions of the second semiconductor island to form source and drain regions with the gate electrode above the second semiconductor island acting as a mask;

forming a dielectric layer on the gate insulating layer, the gate electrodes, and the source and drain electrodes;

patterning the dielectric layer to form a plurality of contact holes via the dielectric layer and the gate insulating layer exposing part of the surface of source/ drain regions and electrodes;

forming a patterned second conductive layer on predetermined parts of the dielectric layer to achieve the electrical connection of the LDD region and the electrical connection of the n-type MOS TFT and the p-type MOS TFT through the contact holes.

16. The method as claimed in claim 15, further comprising, before forming the semiconductive layer on the substrate, forming a buffer layer on the substrate.

17. The method as claimed in claim 15, wherein the semiconductive layer is a crystalline silicon layer.

18. The method as claimed in claim 17, wherein the method of forming a crystalline silicon layer comprises:

forming an amorphous silicon layer on the substrate; and crystallizing the amorphous silicon layer to form the crystalline silicon layer by thermal application or excimer laser annealing (ELA) through a solid or liquid phase growing.

19. The method as claimed in claim 15, wherein the thickness of the gate insulating layer is 50 nm to 150 nm.

20. The method as claimed in claim 15, wherein the thickness of the dielectric layer is 300 nm to 3000 nm

21. The method as claimed in claim 15, wherein the plurality of contact holes is formed simultaneously by one photolithography step.

* * * * *